United States Patent [19]
Engeler et al.

[11] 3,988,773
[45] Oct. 26, 1976

[54] SELF-REGISTERED SURFACE CHARGE RECEIVE AND REGENERATION DEVICES AND METHODS

[75] Inventors: William E. Engeler, Scotia; Jerome J. Tiemann, Schenectady, both of N.Y.

[73] Assignee: General Electric Company, Schenectady, N.Y.

[22] Filed: Dec. 23, 1974

[21] Appl. No.: 535,589

Related U.S. Application Data

[62] Division of Ser. No. 84,665, Oct. 28, 1970.

[52] U.S. Cl. ............................. 357/24; 307/221 D; 307/304
[51] Int. Cl.² ................. H01L 27/10; H01L 29/78
[58] Field of Search ....... 357/24; 307/221 D, 221 C, 307/304

[56] References Cited
UNITED STATES PATENTS 3,660,697   5/1972   Berglund et al. ..................... 357/24
3,760,202   9/1973   Kosonocky ......................... 357/24
3,858,232   12/1974  Boyle et al. ........................ 357/24

FOREIGN PATENTS OR APPLICATIONS 2,111,771   9/1972   France ................................ 357/24

Primary Examiner—William D. Larkins
Attorney, Agent, or Firm—Julius J. Zaskalicky; Joseph T. Cohen; Jerome C. Squillaro

[57] ABSTRACT

Apparatus and methods for regenerating electrical charges to predetermined levels are disclosed. In one embodiment, electrical charges are regenerated in response to a changed voltage condition on an electrically isolated diffused region adapted to receive such charges. The regenerated charges are of predetermined magnitudes substantially independent of the magnitude of the received charge except for whether or not the received charges are above or below a threshold value. Means for regenerating a level of charge substantially less than 100 per cent of a normalized charge are also disclosed.

4 Claims, 7 Drawing Figures

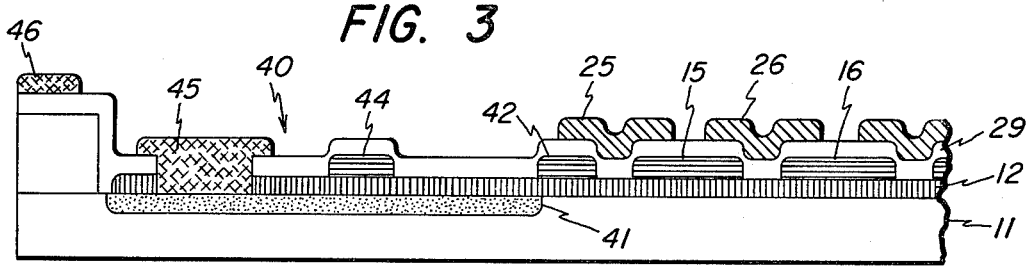
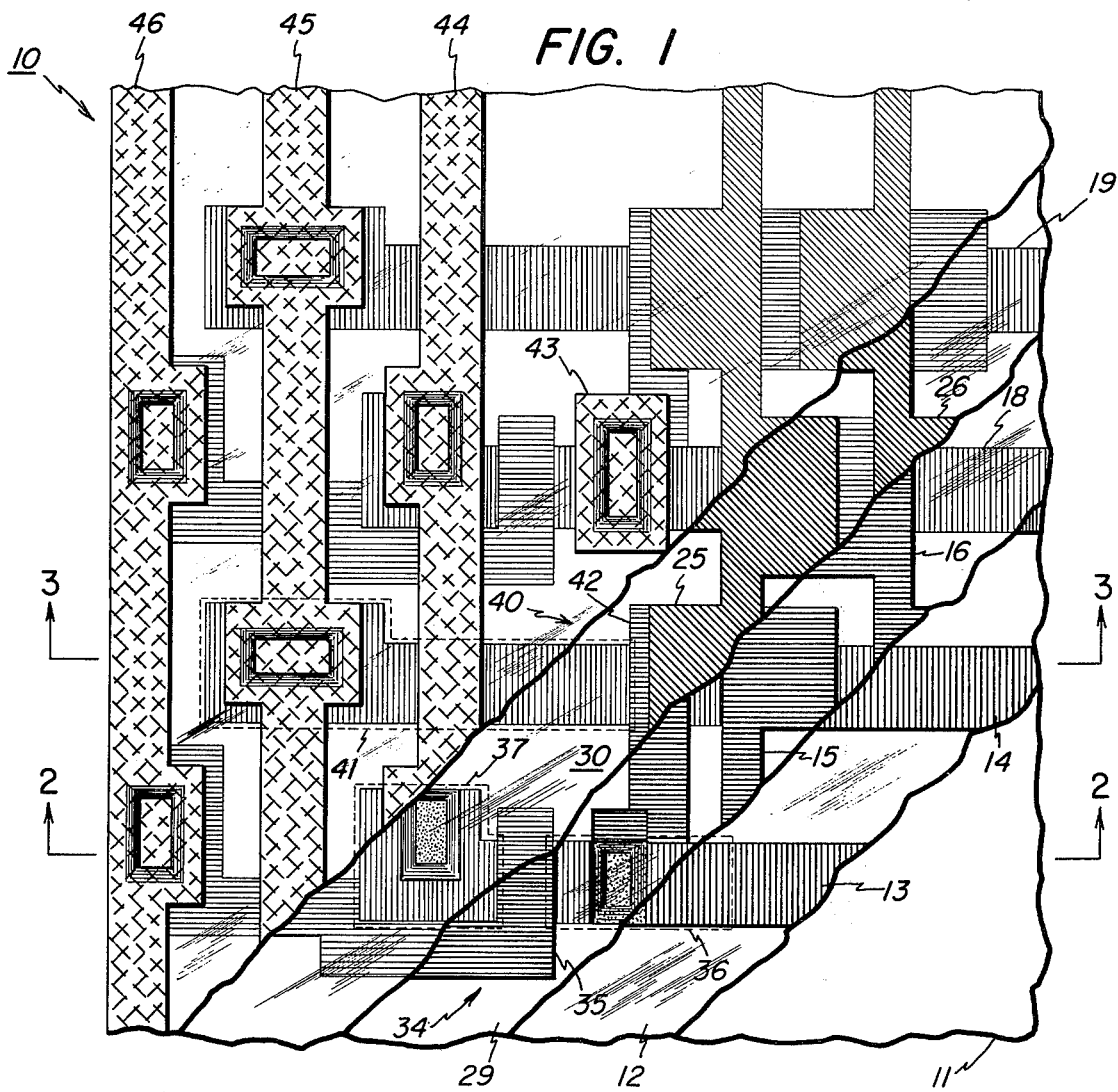
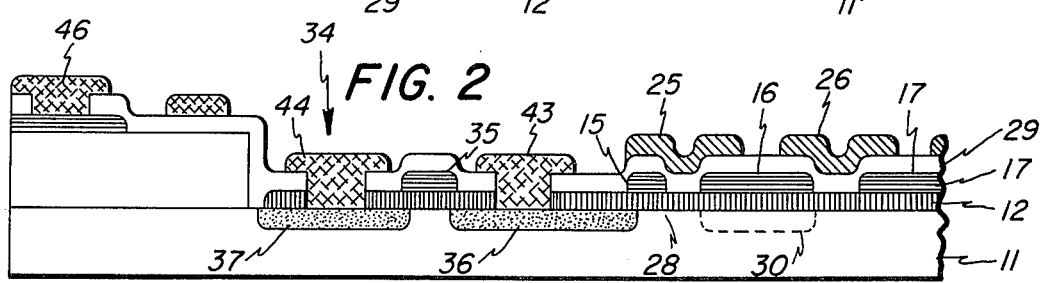

SELF-REGISTERED SURFACE CHARGE RECEIVE AND REGENERATION DEVICES AND METHODS

This is a division, of application Ser. No. 84,665, filed Oct. 28, 1970.

The present invention relates to semiconductor devices and more particularly to semiconductor surface charge transfer and storage devices which are formed as part of a conductor-insulator-semiconductor apparatus. This application is also related to our copending applications Ser. No. 56,353, filed July 20, 1970, (U.S. Pat. No. 3,795,847) and Ser. Nos. 69,649 (U.S. Pat. No. 3,770,988) and 69,651, (U.S. Pat. No. 3,898,685) filed Sept. 4, 1970, and concurrently filed applications Ser. Nos. 84,666, now abandoned, and 84,659, U.S. Pat. No. 3,902,186, all of common assignee to which this invention is assigned and incorporated herein by reference thereto.

The aforementioned copending applications have disclosed methods and apparatus for storing and transferring electrical charges along the surface of a semiconductor substrate. Additionally, application Ser. No. 69,649 discloses a self-registered surface charge launch-receive device employing a single diffused region which extends under a conductor member of a storage element to launch and receive surface charges along a semiconductor substrate. In the applications Ser. Nos. 56,353 and 69,651 we have disclosed methods and apparatus for transferring electrical charges from one location to another on a semiconductor substrate. During the course of charge transfer, however, a small portion of the electrical charge is lost to the semiconductor bulk or remains in the previous storage region and is not fully transferred. Where long trains of storage elements are employed, the loss of charge for whatever reason may present a serious problem since it represents the loss of information stored in the semiconductor in the form of electrical charges.

The loss of electrical charges during the transfer process is found not only to be dependent upon the number of transfers, however, but also the speed of transfer. More particularly, as the speed of transfer increases, less and less of the electrical charge is transferred from one location to another and hence the rate of signal degradation increases very rapidly with speed of transfer. Additionally, in the case in which the information stored is representative of binary 1's and 0's, with full charge representing a binary 1 and no charge representing a binary 0, at high rates of transfer, the charges tend to become distributed equally and hence the information contained therein is lost.

Superimposed over each of the aforementioned problems is the storage time of the semiconductor substrate itself. Normal recombination effects in the semiconductor due to thermally generated minority carriers cause transferred charges to be increased in amplitude due to the accumulation of this charge at the storage site. Accordingly, the exploitation of this method of storing and transferring electrical charges can only be realized to its fullest extent if these charges can be periodically regenerated or refreshed in a controlled manner. Additionally, it is essential that any regeneration apparatus be compatible with the semiconductor technology employed to fabricate the electrical charge storage devices and also be compatible with the desired density of adjacent storage elements.

It is therefore an object of our present invention to provide a method and apparatus for regenerating or refreshing electrical signals stored in the form of surface charges in a semiconductor substrate.

It is a further object of this invention to provide a method and apparatus for providing a predetermined current flow in response to an electrical charge.

It is another object of this invention to provide a regenerated electrical charge of a predetermined amount in response to an electrical signal above a threshold value.

It is yet another object to provide semiconductor charge storage apparatus including high density charge receive and refresh devices.

It is still a further object of this invention to provide predetermined regeneration signal levels in response to signals above and below a threshold value.

Still another object of this invention is to provide signal regeneration and redirection compatible with bi-directional high density storage arrays.

Briefly, and in accord with one embodiment of our present invention, electrical charges, degraded in amplitude as a result of transfer and storage along the surface-adjacent portions of a semiconductor substrate, are regenerated by controllably altering the current into an adjacent storage channel in response to a changed voltage condition on an electrically isolated diffused region adapted to receive the amplitude degraded charge. In one embodiment, this is achieved by providing an insulated gate field-effect transistor with one of its two diffused regions adjacent an electrical charge storage region so that electrical charges stored in the storage region can be controllably introduced into or removed from the adjacent diffused region. Means are provided for periodically charging this diffused region to a predetermined potential so that an electrical charge introduced into said isolated diffused region can alter the predetermined potential by an amount proportional to the magnitude of the electrical charge. This change in potential, when above a predetermined threshold level, interrupts the current in another charge storage channel and provides a first low level predetermined output signal. When the change in potential is below the threshold level, a second predetermined output signal level results. In addition to regenerating the received signal, the change in output condition may be employed to provide an electrical readout or control for other external circuitry.

In accord with another embodiment of our invention wherein only a portion of the total charge is transferred from one storage element to another, such as is described in our concurrently filed applicaton Ser. No. 84,666, means are provided for regenerating different predetermined charge levels in accord with the magnitude of the received charge relative to a threshold level.

The novel features believed characteristic of our present invention are set forth in the appended claims. The invention itself, together with further objects and advantages thereof, may be best understood by reference to the following detailed description taken in connection with the appended drawing in which;

FIG. 1 is a partial plan view of an embodiment of our invention including an electrical charge receive and regeneration device;

FIG. 2 is a partial cross-sectional view taken along the lines 2—2 of FIG. 1;

FIG. 3 is a partial cross-section view taken along the lines 3—3 of FIG. 1;

Figure 4:
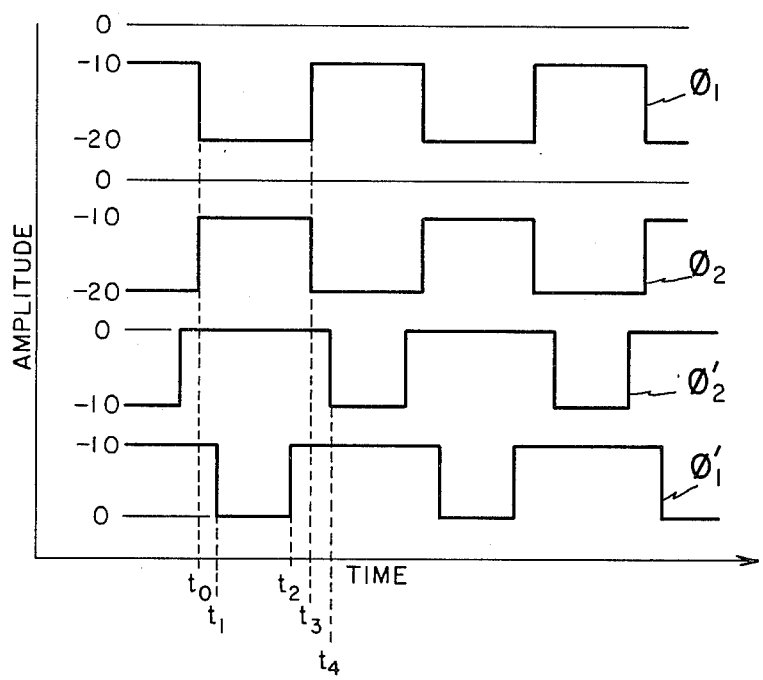
FIG. 4 illustrates typical voltage waveforms suitable for transferring and storing electrical charges along the surface of a semiconductor substrate.

By way of example, FIG. 1 illustrates a partial plan view of an embodiment of our invention including a conductor-insulator-semiconductor (CIS) charge storage and transfer apparatus 10 comprising a semiconductor substrate 11 having an insulator layer 12 thereover. For purposes of clarity in describing our invention, the semiconductor substrate 11 is considered to be N-type silicon, for example, of 1,1,1 crystallographic orientation. It is to be understood, however, that other semiconductor materials, such as germanium, Group III-V and II-VI semiconductor compounds, such as cadmium sulfide, gallium arsenide and indium antimonide, may be employed and other insulator materials, such as silicon nitride, silicon oxynitride or combinations of insulator materials may be employed, if desired. Accordingly, our invention is not limited to any specific material or combination of materials, but includes numerous combinations of materials which produce the desired results in practising our invention.

The insulator layer 12 is provided with a plurality of charge transfer channels formed therein, with channels 13, 14, 18 and 19 illustrated in the drawing. For example, these channels may be formed by selected etching of the insulator material to the semiconductor surface and then reforming a thinner insulator layer of a specific thickness. For example, the insulator layer may comprise a pyrolytically formed silicon dioxide layer having a thickness of approximately 10,000 A.U. in the regions outside the channels and a thickness of about 1,000 A.U. in the channel regions. As will become more apparent from the following description, the thickness of the insulator layer may vary with the particular circuit parameters since the thicker oxide layer primarily assures that the portions of the semiconductor substrate underlying the thick insulator layer are not activated by signals conducted through the overlying conductor members.

The CIS charge storage and transfer apparatus 10 further comprises a first plurality of conductor members, with only conductor members 15, 16 and 17 illustrated in the drawing. Conductor members 15, 17 and other alternate conductors are connected to a first electrical bus (not shown) and conductor members 16 and other alternate conductors are connected to a second electrical bus (not shown). As illustrated, conductor members 15 and 17 are interdigitated with conductor members 16. The conductor members 15 through 17 and the common electrical buses are formed, for example, by depositing a continuous conductive material over the insulator layer 12 and then appropriately masking and etching this conductive layer to form the illustrated conductor members. Conductive materials such as molybdenum, tungsten, silicon, germanium or any of the other numerous nonreactive, conducting and semiconducting materials capable of withstanding thermal stresses may advantageously be employed in practising our invention. Conductors having high conductivity such as tungsten and molybdenum are particularly desirable where long, narrow conductor members are employed. The formation of such conductors is described in greater detail in application Ser. No. 679,957 (U.S. Pat. No. 3,566,518) of Brown et al assigned to the common assignee and incorporated herein by reference thereto.

FIG. 2, a partial cross-sectional view taken along the lines 2—2 of FIG. 1, more clearly illustrates the arrangement of conductor members 15 through 17. FIG. 2 also illustrates a second plurality of conductor members with conductor members 25 and 26 illustrated in the drawing. These conductors are insulatingly disposed in overlapping relation with adjacent conductor members of the first plurality. A layer of insulating material 29 provides electrical insulation between the first plurality of conductor members and the second plurality of conductor members. The insulator material 29 may, for example, be any useful insulator material such as pyrolytically deposited silicon dioxide and having a thickness of approximately 1,000 A.U. The second plurality of conductor members, like the first plurality of conductor members, are arranged in an interdigitated manner with conductor member 25 connected to a third electrical bus (not shown) and conductor member 26 connected to a fourth common electrical bus (not shown). The electrical buses provide means for connecting signals to the various conductor members and may, for example, be conveniently located along the ends of the CIS structure.

The CIS structure further includes a charge receive and refresh device 30 comprising a receive assembly 34 including an insulated gate field-effect transistor, for example, formed in the channel region 13 adjacent the conductor member 25. The receive assembly 34 further comprises a gate electrode 35 insulatingly disposed over the semiconductor substrate 11 and in overlapping relation with diffused regions 36 and 37 formed in the surface-adjacent portion of the semiconductor substrate 11. The insulated gate electrode 35 may, for example, be formed of the same conductive material employed for the conductor members 15 through 17 and photolithographically patterned and etched at the same time. The diffused regions 36 and 37 may, for example, be formed by impurity diffusion from an appropriate source, such as a glass containing boron. Methods for making field-effect transistors of this type are well known in the art; however, in practising our invention most advantageously, the methods for making self-registered field-effect transistors more fully described in the commonly assigned copending patent applications of Brown et al, Ser. Nos. 675,227 (U.S. Pat. No. 3,640,782) and 675,228, (U.S. Pat. No. 3,566,517) filed Oct. 13, 1967, incorporated herein by reference thereto, provide process technology compatible with the charge receive and regeneration device described herein.

In accord with this embodiment of our invention, charge regeneration is provided by a regeneration device 40 illustrated in partial cross-sectional view in FIG. 3. The regeneration device 40 comprises a diffused region 41, such as a P-type diffused region, formed in the surface-adjacent portion of the semiconductor substrate 11 adjacent an insulatingly overlying electrode 42, hereinafter referred to as a launch gate. Electrical contact is made to the diffused region 41 of the charge regeneration device 40 and the diffused regions 36 and 37 of the charge receive assembly 34 by appropriately etching holes through the insulator layer to the surface of the semiconductor substrate and then depositing a conductive layer over the surface of the insulator layer. This forms a joint contact with the silicon diffused region 36 and the launch gate 42. As is well known in the art, a variety of materials including aluminum, molybdenum, and tungsten, for example, may advantageously be employed. It is preferred, however, for high temperature processing that molybdenum, tungsten and the like may be used. The newly deposited conductor layer is then photolithographically masked and etched to produce the desired electrical interconnections between underlying circuit elements. For example, FIG. 1 illustrates an interconnection 43 (illustrated in the next adjacent repetitive channel 18, for purposes of clarity) between the launch gate 42 and the P-type diffused region 36. Connections 44 and 45 are made, respectively, to the P-type diffused regions 37 and 41. In the case where aluminum is used for the interconnecting metallization layer, electrical contact is improved by heating the wafer in a hydrogen atmosphere at approximately 500° C for several minutes. It is then generally not necessary further to heat treat the wafer in hydrogen to reduce fast surface state densities.

The charge receive and regeneration device 30 illustrated in FIGS. 1 through 3 may be used in conjunction with various electrical charge transfer and storage apparatus. For example, this device may advantageously be utilized in conjunction with the charge transfer and storage apparatus described in the aforementioned copending applications Ser. Nos. 56,353, 69,649 and 69,651 and, as described previously, in conjunction with the charge transfer and storage apparatus described in our concurrently filed applications Ser. Nos. 84666, now abandoned, and 84659, U.S. Pat. No. 3,902,186.

For purposes of ease of description only, assume that electrical charges are transferred from right to left in the information storage and transfer channel 13 and are received by the receive assembly 34 and regenerated by the charge regeneration device 40 for release to the information storage and transfer channel 14 wherein electrical charges are transferred from left to right. The operation of the charge receive and regeneration device 30 is described with reference to FIG. 4.

FIG. 4 illustrates various expletive voltage versus time waveforms for controllably transferring charges along the surface of the semiconductor substrate. More specifically, FIG. 4 illustrates a first voltage signal $\phi_1$ alternating between a first negative voltage level and a second more negative voltage level. A second voltage signal $\phi_2$ is substantially complementary to the first voltage signal and alternates between substantially the same voltage levels. A third voltage signal $\phi_2'$ is substantially zero at all times except for an interval during which the first signal $\phi_1$ is in its first voltage level condition. A fourth voltage signal $\phi_1'$ is substantially zero at all times except when the first voltage signal is in its second voltage level condition. Voltage signals $\phi_1$ and $\phi_2$ are connected, for example, to the first and second common electrical buses, respectively, and voltage signals $\phi_2'$ and $\phi_1'$ are connected to the third and fourth common electrical buses, respectively.

In a typical mode of operation, assume that an electrical charge underlying conductor member 16 is received by the charge receive element 34. Before the charge can be received, however, the receive element 34 must be ready to accept the charge. This is accomplished by first applying a voltage $V_b$ to the conductor 44 and an appropriate gate voltage to the insulated gate electrode 35. The gate voltage may, for example, be a signal substantially similar to that illustrated in FIG. 4 by the waveform $\phi_2'$. Prior to $t_0$ when $\phi_2'$ is $-10$ volts, the signal applied to the gate electrode 35 is of such a polarity and magnitude with relation to the voltage applied to the conductor 44 and the diffused region 36, that a depletion region is established in the vicinity of the diffused region 36 having a surface potential substantially equal to that of potential $V_b$. Prior to $t_0$, however, the voltage applied to the gate electrode 35 goes to zero and no further current is permitted between the voltage source $V_b$ and the diffused region 36. Hence, the diffused region 36 is isolated electrically from the surrounding regions except for the connection to the launch gate 42.

At time $t_4$, the electrical charge stored beneath the conductor member 16 is transferred to the depletion region surrounding the diffused region 36. This occurs as a result of the lowering of the electrical barrier region 28 existing between the depletion region 30 underlying conductor member 25 and the depletion region around the diffused region 36. For a more comprehensive description of the transfer of charge between adjacent depletion regions by the lowering of a barrier region therebetween, reference is made to our concurrently filed application Ser. No. 84,666.

The transfer of electrical charge from the depletion region 30 underlying conductor member 16 to the depletion region surrounding the diffused region 36 causes a change in voltage on the launch gate 42. This change in voltage reduces the conductivity of the region underlying the launch gate 42 and hence inhibits the injection of electrical charge from the charge regeneration device 40 into the storage and transfer channel 14. Accordingly, it can be seen that the transfer of an electrical charge from the channel 13 to the charge receive element 34 results in no charge being injected into the channel 14. However, in the event that very little or no charge is transferred into the charge receive element 34, there is substantially no change in voltage on the launch gate 42 and hence an electrical charge would be injected into the channel 14. In other words, the charges injected into the channel 14 are complementary to those received from the channel 13. Therefore, if the presence of an electrical charge above a predetermined level is representative of a binary 1, for example, and the absence or presence of a small electrical charge below a predetermined level is representative of a binary 0, then charges injected into the channel 14 in response to those received from channel 13 are complementary binary signals.

It should be noted that the conductivity of the channel region below the launch gate 42 becomes essentially zero for all voltages more positive than a predetermined threshold voltage and that the flow of current for all voltages below this predetermined threshold persists for a sufficient time to permit the first storage region (underlying conductor member 16) of channel 14 to substantially equilibrate with potential $V_a$ applied to the diffused region 41 via the interconnection 45.

The charge receive and regeneration device 30 described in accord with this embodiment of our invention, therefore, provides a regenerated or refreshed signal which is the complement of the received signal. This regenerated signal, however, does not depend on the magnitude of the received charge, but rather is a fixed predetermined signal dependent only on whether or not the transferred charge is above or below a threshold value. Hence, the refreshed signal starts anew and is free of accumulated noise or other distortions which the received signal may have acquired. In this manner, the partial degradation of the charge and any distortions thereof encountered during previous transfers is removed.

The foregoing description is primarily concerned with the regeneration of electrical charges representative of information in a binary form, i.e., a binary 1 is characterized by the presence of a charge and a binary 0 is characterized by the absence of a charge. The concurrently filed application Ser. No. 84,666, discloses the desirability of transferring substantially less than 100 per cent of the total charge for a binary 1 and some electrical charge, such as, for example, 20 per cent or 50 per cent, for a binary 0. These charge levels are sufficiently different so that by establishing a threshold level, charges below this level are considered a binary 0 and charges above this level are considered a binary 1. The regeneration of these charges therefore necessitates a charge receive and regeneration device which is capable of distinguishing between signals above and below this level and regenerating these charges to their original values substantially independent of the magnitude of the received electrical charge. In providing such a charge receive and regeneration device, substantially the same criteria set forth above with respect to the embodiment of our invention illustrated in FIG. 1 is also applicable here. In particular, it is desirable to provide a charge regeneration device which is compatible with the semiconductor technology employed to fabricate the storage array and also to provide a regeneration device which is readily adapted to high density storage arrays.

Figure 5:
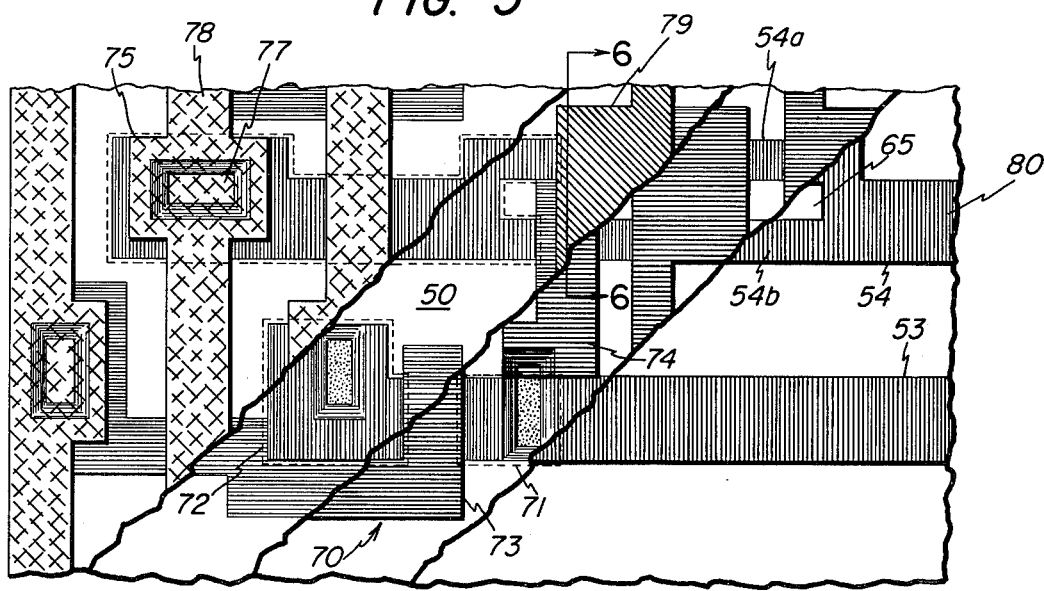
FIG. 5 is a partial plan view of another embodiment of a charge receive and regeneration device.
Figure 6:
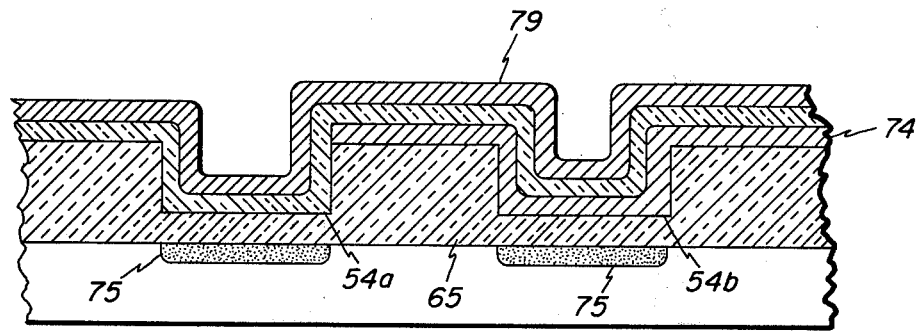
FIG. 6 is a partial cross-sectional view taken along the lines 6—6 of FIG. 5.
Figure 7:
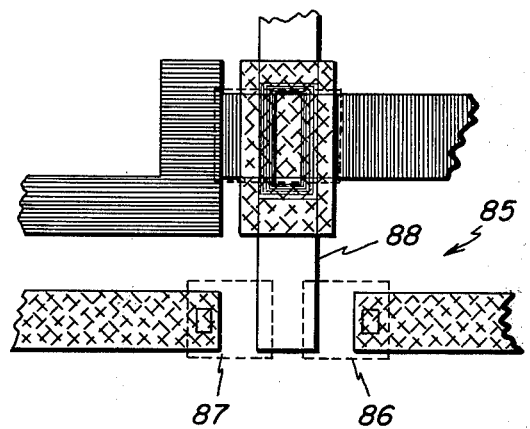
FIG. 7 illustrates a typical electrical readout device for use in conjunction with charge storage and transfer apparatus.

Therefore, in accord with another embodiment of our invention, FIG. 5 illustrates a charge receive and regeneration device 50 suitable for regenerating binary 1's and 0's which are characterized by 100 per cent of a normalized charge and 50 per cent of a normalized charge, respecively. More specifically, the charge regeneration device 50 is adapted to receive charge from an information storage and transfer channel 53 and regenerate the received charges for injection into the next adjacent storage channel 54. As illustrated, however, the charge storage and transfer channel 54 is separated into two substantially equal portions 54a and 54b, separated by a region of thick insulator material 65. Electrical charges are received from the storage channel 53 by a charge receive device 70 substantially similar to that illustrated above with reference to FIG. 1. This device may, for example, include an insulated gate field-effect transistor having source and drain diffused regions 71 and 72 with a gate electrode 73 insulatingly disposed over portions of the source and drain regions. As in the previous embodiment of our invention, contact is made to the diffused region 71 adjacent the storage channel 53. Additionally, contact is made to the diffused region 71 by a launch gate 74 which overlies the channel region 54b and which may, for example, be formed during the masking and etching of the conductor members overlying the semiconductor substrate. Electrical charges are received by the charge receive device 70 in substantially the same manner described above with regard to the embodiment illustrated in FIG. 1 and the charges received at the diffused region 71 alter the voltage on the launch gate 74 so as to control a portion of the current injected into the next adjacent storage channel 54. More specifically, as illustrated in FIGS. 5 and 6, an electrical charge is introduced into the channel regions 54a and 54b through a diffused region 75 formed along the surface-adjacent portions of the semiconductor substrate in the channel regions 54a and 54b and underlying a portion of a launch gate 74. Electrical contact between the diffused region 75 and a voltage carrying conductor 78 is provided by the conductor filled aperture 77. Conductor 78 is connected to a source of voltage $V_a$ which is selected so as to inject or introduce charge into the channel region 54. The amount of charge injected is controlled, in part, by the voltage appearing on the gate electrode 74. This voltage is derived from the diffused region 71 which receives the electrical charges being transferred along the transfer channel 53. The voltage applied to the conductor member 78 is adjusted so that when no charge is received by the diffused region 71, the voltage appearing on the gate electrode 74 is sufficient to permit electrical charge to flow in the depletion region formed in the semiconductor as a result of the voltage induced electric field from the gate electrode 74. In addition to the charge injection under the gate electrode 74, charge is also injected into the channel region 54a and is received within the storage region underlying the storage control electrode 79. The two charges injected into the channels 54a and 54b are transferred along each respective channel by the overlying storage (and control electrodes) in substantially the same manner as described above until they arrive at a point 80 along the storage channel where the two signals are combined to produce an electrical charge representative of 100 per cent of a normalized charge.

Electrical charges, therefore, received at the receive device in channel 53 having a magnitude less than a predetermined range of values, such as a binary 0, produce a complementary binary 1 in the next adjacent channel 54 by the charge regeneration apparatus contained therein. If, however, the charge received by the diffused region 71 is above a predetermined threshold level, its magnitude is sufficient to alter the charge and hence the voltage applied to the gate electrode 74 so that electrical charges are inhibited from flowing along the storage and transfer channel 54b. The electrical charge flowing along the channel 54a, however, is not inhibited and hence this charge is transferred along the channel to the point 80 where there is no charge to combine therewith and hence the charge transferred into the main portion of the storage and transfer channel 54 is only a portion of that previously transferred.

The charge injected into the storage channel 54 is therefore the sum of the charges injected into the channels 54a and 54b. In the event that the signal received at the diffused region 71 is above a predetermined threshold value, no charge is injected into the channel 54b and hence the only charge injected into the storage channel 54 is that from the channel 54a. Since the charge injecting voltage $V_a$ is used for injecting charges into both channels 54a and 54b, by adjusting the areas of the channel regions 54a and 54b, the percentage of charge injected by each is established. For example, by making the areas of channels 54a and 54b equal, each provides approximately 50 per cent of the total charge injected into the storage and transfer channel 54. In this way, regeneration of charges on a 50 per cent and 100 per cent basis are obtained. Obviously, other proportions may be utilized if desired.

Several particularly advantageous characteristics of our invention can be better appreciated by considering the charge regeneration of binary 1's and 0's wherein the binary 1 is considered to be any electrical charge which varies within a first predetermined range and a binary 0 to be any electrical charge which varies within a second predetermined range. For example, if the first predetermined range varies between 60 and 100 per cent of a normalized charge and the second predetermined range varies between 10 and 50 per cent of a normalized charge, then by regenerating charges within the first predetermined range to 100 per cent of the normalized charge and charges within the second predetermined range to 50 per cent of the normalized charge, each charge is permitted to degrade approximately 80 per cent before charge regeneration is necessary. At that time, the charge receive and regeneration device illustrated in FIG. 5 may be used to provide periodic regeneration of the original amplitudes so that the information contained therein is not lost.

Another particularly advantageous characteristic of our invention is the ability to receive an electrical charge flowing in one direction and regenerate and redirect or "turn around" the electrical charge so that in the next adjacent channel it is transported in an opposite direction. This feature of our invention is particularly desirable since it permits high density storage arrays to be fabricated on semiconductor substrates of small dimensions.

In addition to providing signal regeneration, in accord with another object of this invention, means are provided for obtaining an output signal from an information storage and transfer channel by utilizing the received charge on the isolated diffused region of the insulated gate field-effect transistor to control still other apparatus in addition to the regeneration devices disclosed herein. For example, by using the change in voltage on the isolated diffused region to control current flow through another insulated gate field-effect transistor, an output signal can be obtained from the storage channel.

FIG. 6 illustrates, by way of example, a typical output device 85 which is illustrated as comprising a field-effect transistor including source and drain diffused regions 86 and 87, respectively, with an insulated gate electrode 88 overlying portions of the diffused regions. The insulated gate electrode is also connected to the isolated diffused region adjacent the storage channel from which information is received. Those skilled in the art can readily appreciate that the output device 85 may be connected in various configurations, such as, for example, a source follower or a common source amplifier. In either event, any additional components, such as resistors or diodes, etc., may be fabricated in the semiconductor substrate, if desired, or alternately, may be separate and discrete components, if desired. Further, in addition to providing an electrical readout device, the control element may be further extended so as to control the injection of charge into still another device.

In summary, we have disclosed novel methods and apparatus for regenerating electrical signals stored in the surface-adjacent portions of a semiconductor substrate and redirecting these charges along specific channels or to other specific devices for use in controlling various devices. The novel structural arrangement of elements provides charge regeneration to different predetermined levels in accord with the magnitude of the received signal and its relation with a predetermined threshold level. In accord with our invention, long trains of high speed, high density charge storage devices are possible.

While only certain embodiments and examples of our present invention have been described herein, it is apparent that many modifications and changes will occur to those skilled in the art. For example, whereas the insulator layer thickness in the channel regions is described as being approximately 1,000 A.U., it is to be understood that other thicknesses of insulator material may also be employed. For example, insulator thicknesses in excess of 200 A.U., where silicon nitride is used, or in excess of 500 A.U. where silicon dioxide is used, are suitable for practising our invention. While thicknesses greater than 1,000 A.U. are also possible, the magnitude of the voltage signals necessary to provide charge storage and transfer becomes inordinately high, and are hence not preferred. Further, the conductor members may be of varying thickness and depend primarily upon the conductivity of the material employed and the length of the conductor itself. For example, where high conductivity materials, such as molybdenumm and tungsten are employed, the thickness of the conductor members may be 1,000 A.U. or less if the conductor length is not great. For example, methods other than diffusion may be used to produce regions of opposite conductivity type such as selective epitaxial growth and ion implantation, for example. Those skilled in the art can readily appreciate that various combinations of thicknesses and lengths are possible and our invention is not limited to any specific combination of materials or lengths. Accordingly, we intend, by the appended claims to cover all such modifications and changes as fall within the true spirit and scope of our present invention.

What we claim as new and desire to secure by Letters Patent of the United States is:

1. Semiconductor surface charge storage and transfer apparatus comprising a semiconductor substrate of one conductivity type, means for forming a first and second plurality of serially arranged charge storage regions in said substrate, means for transferring charge along said storage regions of said first and second plurality, means for introducing charge into said first plurality of serial arranged storage regions, an electrically isolated region of opposite conductivity type adjacent one of said storage regions of said first plurality, means for charging said region of opposite conductivity type to a predetermined potential, means for altering said predetermined potential by transferring charge from one of said storage regions of said first plurality into said region of opposite conductivity type, another source of charge in said substrate adjacent another storage region of said second plurality, means for controlling the transfer of charge from said other source of charge into said other storage region to regenerate the level of said charge received from said one region, said means including a charge storage and transfer channel between said other source of charge and said other storage region including a first portion into which a predetermined constant charge is injected and a second portion into which a predetermined alterable charge is injected in response to the altered potential of said one region of opposite conductivity.

2. The apparatus of claim 1 wherein said channel means transfers a first quantity of charge into said other storage region in response to an altered potential of said one region of opposite conductivity type below a predetermined threshold and a second quantity of charge in response to an altered potential above said threshold.

3. The apparatus of claim 1 in which said means for controlling the transfer of charge from said other source of charge into said other storage region includes a launch gate in said other portion of said charge storage and transfer channel conductively connected to said region of opposite conductivity type.

4. Semiconductor surface charge storage and transfer apparatus comprising
a semiconductor substrate of one conductivity type,
means for forming a plurality of serially arranged charge storage regions in said substrate,
means for transferring charge along said serially arranged storage regions,
a source of charge in said substrate adjacent a storage region of said plurality,
means for controlling the transfer of charge from said source of charge into said one storage region.
said means including a charge storage and transfer channel between said source of charge and said one storage region including a first portion into which a predetermined constant level of charge is injected and a second portion into which a level of charge alterable in accordance with a binary signal is injected.

* * * * *